United States Patent [19]

Stewart

[11] Patent Number: 4,610,279

[45] Date of Patent: Sep. 9, 1986

[54] METHOD AND APPARATUS FOR CUTTING AND BENDING RESISTOR LEADS OR THE LIKE

[75] Inventor: Jack D. Stewart, Furlong, Pa.

[73] Assignee: Stewart Enterprises, Inc., Furlong, Pa.

[21] Appl. No.: 663,671

[22] Filed: Oct. 22, 1984

[51] Int. Cl.⁴ .............................................. B21F 45/00
[52] U.S. Cl. .................................... 140/105; 72/326; 72/385
[58] Field of Search ............. 140/105, 106, 123, 71 R; 72/386, 385, 326; 74/104, 107

[56] References Cited

U.S. PATENT DOCUMENTS

| | | | |
|---|---|---|---|
| 736,965 | 8/1903 | Harris | 74/104 |
| 2,450,920 | 10/1948 | Shand | 140/71 R |
| 2,737,211 | 3/1956 | Perry et al. | 140/71 R |
| 3,796,201 | 3/1974 | Golub | 140/105 |
| 3,812,703 | 5/1974 | Tepper | 140/105 |
| 3,872,898 | 3/1975 | Parks | 140/105 |

Primary Examiner—Lowell A. Larson
Attorney, Agent, or Firm—Joseph W. Molasky

[57] ABSTRACT

A cutter-bender tool for the cutting and bending of resistor leads is described. The cutter-bender tool is simple to operate and involves an operating procedure whereby the resistor is simply dropped into a slot and a handle is depressed. Upon release of the handle, the finished, trimmed and bent resistor drops from an outlet slot in the bottom of the tool.

7 Claims, 6 Drawing Figures

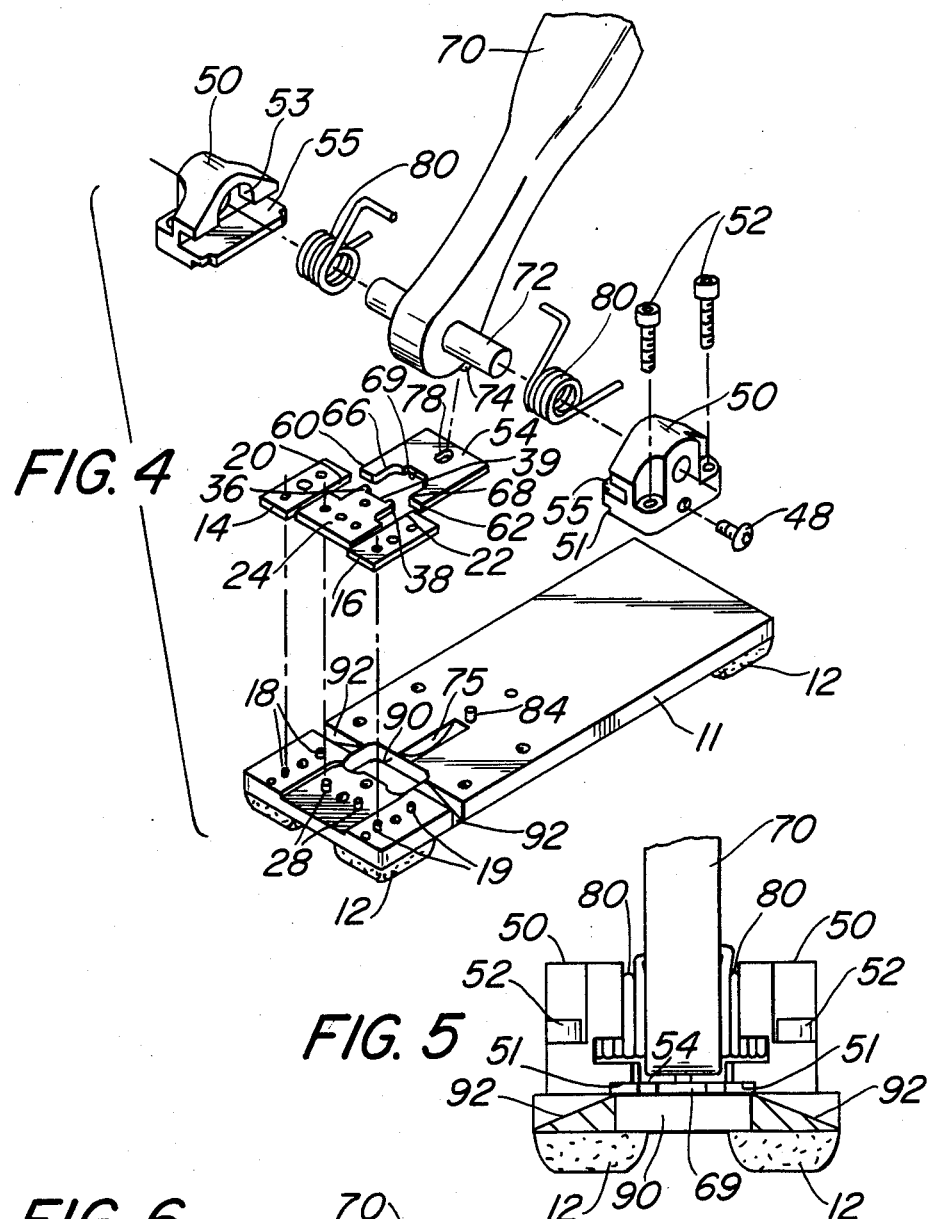
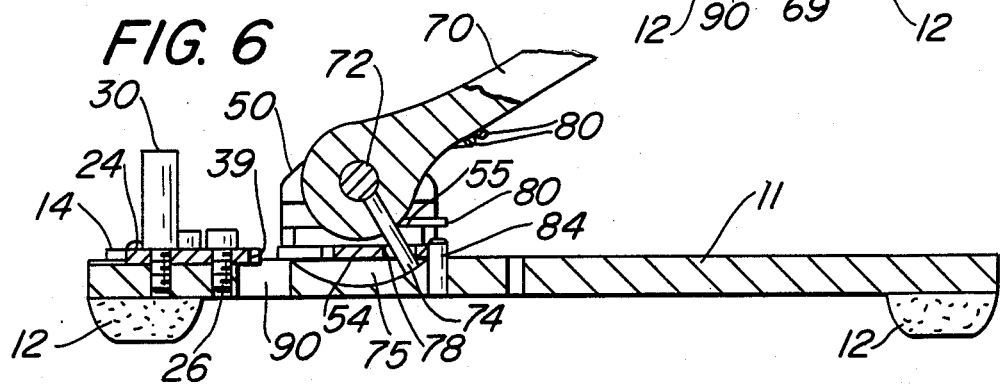

METHOD AND APPARATUS FOR CUTTING AND BENDING RESISTOR LEADS OR THE LIKE

BACKGROUND AND SUMMARY OF THE INVENTION

There have been provided various machines and devices for the cutting and bending of resistor leads in preparation for the insertion thereof in printed circuit boards or for other purposes. Fully automatic high volume benders are known but are not practical in many applications involving small amounts of resistors of different values. There have been provided special types of pliers designed for lead bending and clipping in applications when the high volume benders are not practical. However, these pliers involve tedious and inexact operations and are not entirely satisfactory.

In accordance with the invention there is provided a hand-operated mechanized alternative to the use of pliers for the cutting and bending of resistor lead wires. The cutter-bender of the invention is particularly handy for prototype assembly, repair and low volume production manufacture or as an adjunct of a mass-production operation. The cutter-bender of the invention is simple to operate and involves a method whereby the resistor is simply dropped into a slot and a handle is pressed. Upon release of the handle, the finished, trimmed and bent resistor drops from an outlet slot in the bottom of the device. Moreover, the cutter-bender in accordance with the invention is simple in construction and can be manufactured at a minimum cost.

The invention also comprises a novel method for the hand-operated cutting and bending of the leads of resistors or similar articles. The cutter-bender of the invention is applicable to articles which have a generally cylindrical body and wires extending axially from the ends of the cylindrical body, such articles including resistors, diodes or the like.

BRIEF DESCRIPTION OF THE DRAWINGS

FIG. 4 is an exploded view of the cutter-bender of the invention.

FIG. 5 is a sectional view taken on line 5—5 of FIG. 2.

FIG. 6 is a sectional view taken on line 6—6 of FIG. 2.

DETAILED DESCRIPTION

Figure 1:
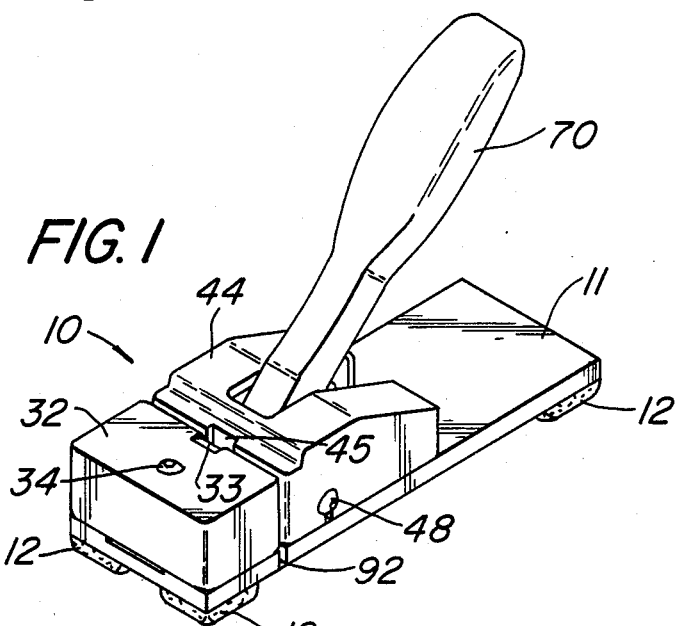
FIG. 1 is a perspective view of a cutter-bender in accordance with the invention.

The cutter-bender 10 of the invention shown in the Drawings comprises a flat rectangular base 11 provided with four feet 12 each of which is located at a corner of base 11 for supporting same. In the operating position of the cutter-bender 10, which position is best shown in FIGS. 1 and 6, base 11 is supported in a horizontal position on a table or the like by the feet 12.

A pair of cutter members 14 and 16 are fixedly mounted on base 11 by mounting screws 15 and 17, respectively. Cutter members 14 and 16 comprise plates located in position on base 11 by two sets of dowels 18 and 19, respectively. Cutter members 14 and 16 provide a pair of straight cutting edges 20 and 22, respectively, arranged in spaced apart parallel relation as shown in the Drawings.

A nest member 24 is fixedly mounted on base 11 by a mounting screw 26 and is located in position between cutter members 14 and 16 by a pair of dowels 28. Nest member 24 is also secured in position by means of a vertical post 30 screwed onto base 11 and mounted on top of nest member 24 as is best shown in FIG. 6. Post 30 is used to secure the front cover 32 on base 11 by means of a mounting screw 34.

Figure 2:
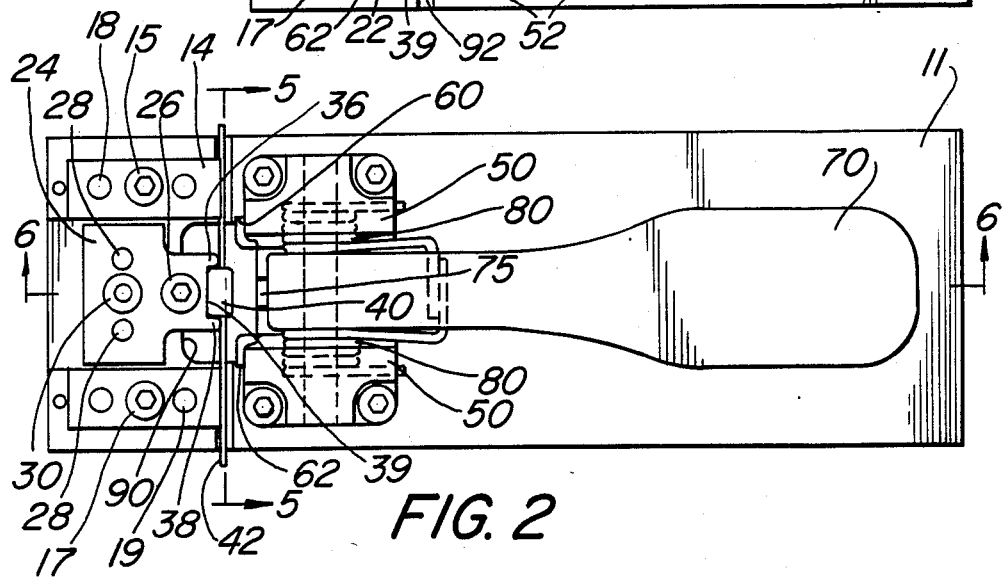
FIG. 2 is a top plan view of the cutter-bender shown in FIG. 1 with the covers removed for clarity of illustration.

Nest member 24 has a pair of bend portions 36 and 38 which define the desired bent shape and center distance of the resistor leads to be operated on by the cutter-bender 10. Nest member 24 also has a third portion which defines a recess 39 for receiving the cylindrical body 40 of the resistor to be operated on as is best shown in FIG. 2. As is shown in the Drawings, the bend portions 36 and 38 are spaced apart and the recess 39 is formed therebetween. Also, the resistor to be operated on has a pair of leads 41 and 42 which extend axially from body 40 adjacent the bend portions 36 and 38, respectively, and across the cutting edges 20 and 22, respectively, when the resistor is located in the operating position in preparation for a cutting and bending operation as is shown in FIG. 2.

Means are provided for supporting a resistor with its body 40 received in recess 39 and its leads 41 and 42 extending adjacent bend portions 36 and 38 and across cutting edges 20 and 22 as shown in FIG. 2. Such means comprises the front cover 32 which is mounted on the front portion of base 11 to enclose the cutter members 14 and 16 and the nest member 24 as is shown in FIG. 1. Front cover 32 provides a vertically extending wall which conforms to the shape of a resistor to be operated on and has a vertical recess 33 forming a chute leading to and conforming to the shape of the recess 39. The resistor supporting means also comprises a main cover 44 mounted adjacent front cover 32 and providing a vertical wall also defining the outline of a resistor to be operated on as is shown in FIG. 1. To this end, cover 44 defines a vertical recess 45 opposite recess 33. Recess 45 forms a vertical chute leading to a location adjacent base 11 so as to position a resistor as shown in FIG. 2 with its body 40 received in recess 39 of nest member 24. Main cover 44 is secured in position on base 11 by means of a pair of mounting screws 48 which cooperate with the sides of cover 44 and threadedly engage a pair of blocks 50 mounted on the top of base 11 by a pair of mounting screws 52.

Figure 3:
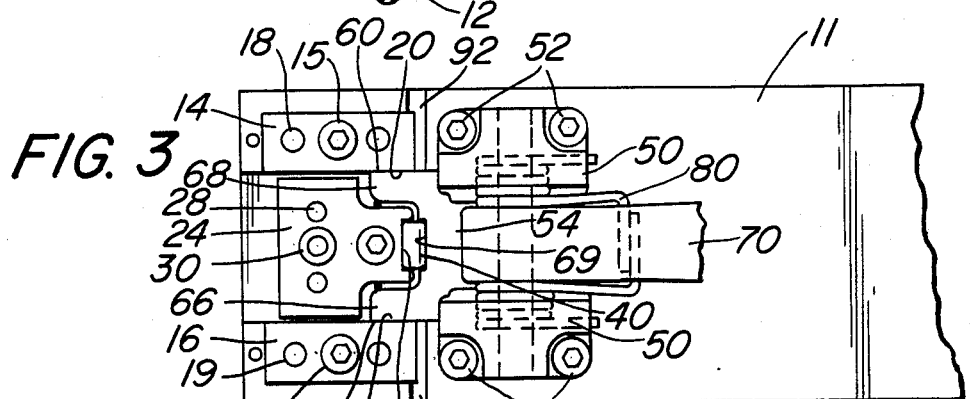
FIG. 3 is a fragmentary top view similar to FIG. 2 with the parts shown in an alternate operating position.

A cutter-bender member 54 is mounted for movement across the top surface of base 11 from a start position shown in FIG. 2 to an actuated position shown in FIG. 3. To this end, cutter-bender member 54 is received in elongated recesses 51 extending lengthwise of base 11 in the bottom of blocks 50 for guiding member 54 through its sliding movement. Member 54 has a pair of spaced apart cutter portions 60 and 62 aligned with fixed cutting edges 20 and 22, respectively. Member 54 has a pair of bend portions 66 and 68 aligned with the pair of bend portions 36 and 38, respectively, of nest member 24. Also, member 54 has a portion defining a recess 69 which is opposite recess 39 of member 24 as is shown in the Drawings.

Means are provided for actuating cutter-bender member 54 through an operating movement from said start position of FIG. 2 to said actuated position of FIG. 3. Said actuating means comprises a handle 70 mounted for pivotal movement about the axis of a pin 72 secured in the lower end of handle 70 and rotatably mounted in horizontal extending holes in blocks 50. A pin 74 is carried by lower portion of handle 70 and extends downwardly therefrom to be engaged in a slot 78 in member 54. Base 11 is provided with an arcuate cutout 75 for receiving the end of pin 74 as it is moved by handle 70 and actuated through the operating movement of cutter-bender 10.

There is provided spring means for biasing the handle 70 upwardly to a position wherein it maintains the cutter-bender member 54 in its start position shown in FIG. 2. Such spring means comprises a pair of coiled springs 80 mounted on the horizontal pin 72 on opposite sides of handle 70 and received in recesses 53 in blocks 50. One end of each spring 80 is engaged with a horizontal wall 55 in an associated block 50 while the other ends thereof engage the underside of handle 70, the arrangement being such that the springs 80 are placed in a coiled condition to urge handle 70 upwardly away from base 11.

A stop means is mounted on base 11 to limit the movement of the cutter-bender member 54 in a direction away from nest member 24 to hold the same in said start position as shown in FIG. 2. This stop means comprises a stop pin 84 received in a hole in base 11 and located in alignment with the back end of member 54 as shown in the Drawings.

Base 11 is provided with a generally rectangular opening 90 aligned with the bend portions 36 and 38 and recess 39 of nest member 24. This opening 90 is of a size such that a cut and bent resistor will fall through the opening 90 to a location beneath base 11.

There is provided a pair of lead discharge slides 92 formed in the base 11 as best shown in FIG. 4. Each discharge slides 92 has an inclined surface extending outwardly and downwardly from a location adjacent opening 90 and the cutting edges 20 and 22 of the fixed cutter members 14 and 16 to the outer edges of base 11. The inclined surfaces of slides 92 serve to direct the cut-off portions of the leads to the sides of the base 11 at the end of a cutting and bending operation.

The operation of cutter-bender 10 and the method by which it cuts and bends the leads of a resistor will now be described.

Cutter-bender 10 is placed on a horizontal table in a position as illustrated in FIG. 1 and a resistor is simply dropped into the slot formed between the front cover 32 and main cover 44 with the cylindrical body 40 of the resistor being inserted in the vertical delivery chute formed between recesses 33 and 45 of covers 32 and 34. The resistor will then fall to a position as shown in FIG. 2 with the body 40 thereof received within the recess 39 of nest member 24 and the leads 41 and 42 extending laterally to be supported on the top edge of the discharge slides 92 of base 11. The handle 70 is then depressed to actuate member 54 forwardly the position shown in FIG. 2 to the position shown in FIG. 3. This movement of member 54 is effected by the pin 74 engaging member 54 at slot 78 and causing it to move forwardly as handle 70 is depressed and caused to pivot in a clockwise direction about the axis of horizontal pin 72, as viewed in FIG. 6. At the initial part of the operating movement of member 54, the cutter portions 60 and 62 of member 54 cooperate with cutting edges 20 and 22 of fixed cutter members 14 and 16 to cut the leads 41 and 42 at the desired length established by the location of the fixed cutters 14 and 16. As handle 70 is depressed further, member 54 continues to move toward the front end of base 11 and its bend portions 66 and 68 cooperate with the bend portions 36 and 38 of the nest member 24 to bend the cut leads 41 and 42 around the bend portions 36 and 38 to form the desired bent shape of the resistor leads. Thus, at the end of the handle motion, the resistor is cut to its desired length and bent to the desired center distance.

Handle 70 is then released, whereupon the springs 80 return the handle 70 to the start position shown in FIG. 2. During this movement of handle 70, pin 74 engages member 54 to move it toward the rear until it is stopped by pin 84 as described above. The bent resistor will usually travel along with the moving cutter-bender member 54 away from the nest member 24 until it drops through opening 90 onto the table beneath base 11. In the event that the resistor should stick to the member 54 during the return movement, it will be wiped therefrom by contact with the front vertical wall of main cover 44, which extends across the top surface of member 54, and the resistor will fall into opening 90.

What is claimed is:

1. A hand-operated cutter-bender for cutting and bending round resistor leads or the like into a right angle configuration which comprises:

a base adapted to be supported in a horizontal position, a pair of cutter members fixedly mounted on said base to provide cutting edges in spaced apart relation, a nest member fixedly mounted on said base between said spaced apart cutting edges, said nest member having a pair of bend portions defining the desired bent shape of the resistor leads to be operated on, and a third portion defining a recess for receiving the cylindrical body of the resistor to be operated on, said third portion extending between said bend portions, means for supporting a resistor with its cylindrical body at least partially received in said recess of said third portion of said nest member and with the axially extending leads thereof extending adjacent said bend portion of said nest member and across said cutting edges in preparation for a cutting and bending operation, a cutter-bender member mounted for movement across the top surface of said base from a start position to an actuated position, said cutter-bender member having a pair of spaced apart cutter portions aligned with said fixed cutting edges and a pair of bend portions aligned with said pair of bend portions of said nest member, and means for actuating said cutter-bender member through an operating movement from said start position to said actuated position and to a stop position by means of a handle mounted for pivotal movement on said base including a pin carried by said handle and received in a slot in said cutter-bender member, said parts being constructed and arranged so that as said cutter-bender member moves away from said start position the cutter portions thereof will initially cooperate with said fixed cutting edges to cut the resistor leads and so that at a subsequent portion of said operating movement said bend portions of said cutter-bender member will cooperate with said bend portions of said nest member to bend the cut leads from the axially extending position thereof to the desired right angle configuration.

2. A cutter-bender according to claim 1 including spring means for biasing said handle to a position wherein it maintains said cutter-bender member in said start position thereof.

3. A cutter-bender according to claim 1 including stop means mounted on said base to limit the movement of said cutter-bender in a direction away from said nest member to hold same in said start position.

4. A cutter-bender according to claim 1 including foot means for supporting said base on a table or the like to extend in a horizontal position, said handle extending at an acute angle to said base in the start position.

5. A cutter-bender according to claim 1 including cover means defining a vertical chute for guiding a resistor into said position wherein the body thereof is received in said recess of said third portion of said nest member.

6. A cutter-bender according to claim 1 wherein said base is provided with an opening aligned with said bend portion and recess of said nest member, said opening being of a size so that a cut and bent resistor will fall through said opening to a location beneath said base.

7. A cutter-bender according to claim 7 including a pair of discharge slides formed in said base extending outwardly from a location adjacent said cutting edges of said fixed cutters to the outer edges of said base, said discharge slides having an inclined surface.

* * * * *